(12) United States Patent
Kim

(10) Patent No.: US 10,083,649 B2
(45) Date of Patent: Sep. 25, 2018

(54) SEMICONDUCTOR DEVICE HAVING A RESISTOR AND SEMICONDUCTOR INTEGRATED CIRCUIT DEVICES USING THE SAME

(71) Applicant: SAMSUNG ELECTRONICS CO., LTD., Suwon-si, Gyeonggi-Do (KR)

(72) Inventor: Myoung-Soo Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/351,584

(22) Filed: Nov. 15, 2016

(65) Prior Publication Data

US 2017/0162105 A1 Jun. 8, 2017

(30) Foreign Application Priority Data

Dec. 2, 2015 (KR) .................. 10-2015-0170601

(51) Int. Cl.
*G09G 3/20* (2006.01)
*H01L 49/02* (2006.01)
*H01L 27/06* (2006.01)
*H01L 27/02* (2006.01)
*H01L 27/092* (2006.01)
*H01L 27/12* (2006.01)

(52) U.S. Cl.
CPC ....... *G09G 3/2092* (2013.01); *H01L 27/0266* (2013.01); *H01L 27/0288* (2013.01); *H01L 27/0629* (2013.01); *H01L 27/092* (2013.01); *H01L 27/124* (2013.01); *H01L 28/20* (2013.01); *H01L 28/60* (2013.01); *G09G 2320/0233* (2013.01)

(58) Field of Classification Search
CPC ... H01L 27/092; H01L 27/0266; H01L 28/60; H01L 27/0629; H01L 27/0288; H01L 27/124; H01L 28/20; G09G 3/2092; G09G 2320/0233
See application file for complete search history.

(56) References Cited

U.S. PATENT DOCUMENTS

| | | |
|---|---|---|
| 7,154,158 B2 | 12/2006 | Kikuta et al. |
| 7,898,059 B2 | 3/2011 | Remmel et al. |
| 8,089,135 B2 | 1/2012 | Lindgren et al. |
| 8,389,355 B2 | 3/2013 | Won et al. |
| 8,445,353 B1 | 5/2013 | Raghavan et al. |

(Continued)

FOREIGN PATENT DOCUMENTS

| | | |
|---|---|---|
| JP | 2001-203329 A | 7/2001 |
| KR | 1020060078396 A | 7/2006 |

*Primary Examiner* — Abhishek Sarma
(74) *Attorney, Agent, or Firm* — Volentine, Whitt & Francos, PLLC

(57) ABSTRACT

An analogue semiconductor device and a semiconductor IC device including the same include a substrate having a transistor, a MIM capacitor electrically separated from the transistor on the substrate and having a lower electrode, a dielectric layer and an upper electrode, interlayer insulation covering the transistor and the MIM capacitor and a BEOL resistor connected to the upper electrode and equipotential with the lower electrode. The BEOL resistor has a relatively large and easy-variable resistance with minimized parasitic capacitance between the resistor and the lower electrode of the MIM capacitor.

18 Claims, 9 Drawing Sheets

(56) References Cited

U.S. PATENT DOCUMENTS

| | | |
|---|---|---|
| 8,791,545 B2 | 7/2014 | Dalton et al. |
| 8,803,287 B2 | 8/2014 | Dirnecker et al. |
| 9,029,983 B2 | 5/2015 | Chen et al. |
| 2005/0082639 A1* | 4/2005 | Kikuta ................ H01L 27/0629 257/533 |
| 2011/0204480 A1* | 8/2011 | Roest .................. H01L 23/5223 257/532 |
| 2014/0042590 A1 | 2/2014 | Chen et al. |
| 2014/0264750 A1 | 9/2014 | Chang et al. |

* cited by examiner ized semiconductor device having a metal-insulator-metal (MIM) capacitor and to a resistor and a display drive IC (DDI) device including an analogue semiconductor device.

SEMICONDUCTOR DEVICE HAVING A RESISTOR AND SEMICONDUCTOR INTEGRATED CIRCUIT DEVICES USING THE SAME

PRIORITY STATEMENT

This application claims priority under 35 U.S.C § 119 to Korean Patent Application No. 10-2015-0170601 filed on Dec. 2, 2015 in the Korean Intellectual Property Office, the contents of which are hereby incorporated by reference in their entirety.

BACKGROUND

1. Field

The inventive concept relates to a semiconductor device and a semiconductor integrated circuit device including the same. More particularly, the inventive concept relates to an analogue semiconductor device having a metal-insulator-metal (MIM) capacitor and to a resistor and a display drive IC (DDI) device including an analogue semiconductor device.

2. Description of the Related Art

An analogue semiconductor device, which has been widely used for digital components of various electronic systems such as an input/output interface, a power management system, a signal detector and a signal amplifier, generally includes a plurality of active devices such as transistors and a plurality of passive devices such as resistors, capacitors and inductors for an optimal operation of the corresponding digital component.

In particular, the passive devices function to in effect increase the stability and reliability of a digital device of the electronic system including the analogue semiconductor device as well as serve as a circuit component of the analogue semiconductor device.

For example, the resistor of the analogue semiconductor device is usually provided as a derived resistor such as a sink resistor of an electrostatic discharge (ESD) protector and a compensation resistor for compensating for non-uniformity in the luminance of a large-scaled flat panel display device.

The resistor may be formed in a front end of line (FEOL) process together with transistors prior to metal contacts and wirings of the analogue semiconductor device or a back end of line (BEOL) process together with wirings posterior to the transistors of the analogue semiconductor device.

The FEOL resistor usually has poor resistor uniformity due to the metal and wiring processes carried out after the FEOL process. In addition, it is problematic to provide a large resistance by forming the resistor in the FEOL process because an FEOL resistor having a large resistance requires a large area and thus, the chip must be correspondingly large which runs counter to the demand in the industry for small and compact semiconductor devices. In addition, because the FEOL resistor is pre-formed together with the transistors under an interlayer insulation, the FEOL resistor hardly impacts the resistance in the circuit including the analogue semiconductor device, which makes it very difficult to control the resistance of the device.

The BEOL resistor is usually arranged on the interlayer insulation under which various conductive structures such as transistors and contact pads have been formed. Therefore, parasitic capacitance tends to be generated between the underlying conductive structures and the BEOL resistor, which significantly reduces the reliability of the analogue semiconductor device.

In recent times as the integration degree of semiconductor devices has increased, a metal-insulator-metal (MIM) capacitor has been widely used in analogue semiconductor devices due to the fact that an MIM capacitor can provide a large capacitance and exhibits high operational stability. Thus, the parasitic capacitance tends to be quite high between the MIM capacitor and the BEOL resistor as well as between the underlying conductive structures and the BEOL resistor.

In particular, when an analogue semiconductor device requires the derived resistor to provide a resistance in a range of about a few tens of ohms to about a few thousands ohms, the parasitic capacitance between the derived resistor and the conductive structures including the MIM capacitor significantly decreases the reliability and stability of the analogue semiconductor devices.

SUMMARY

According to examples of the inventive concept, there are provided semiconductor devices including a substrate having a transistor, a plurality of metal-insulator-metal (MIM) capacitors, interlayer insulation covering the transistor and the MIM capacitors and interposed between the transistor and the plurality of MIM capacitors, and a resistance comprising at least one resistive body each electrically connected upper electrodes of the MIMS capacitors and equipotential with a lower electrode of the MIM capacitors.

According to other examples of the inventive concept, there are provided semiconductor integrated circuit devices (electronic systems) including a first electronic component that transmits input signals in the device, an electrostatic discharge (ESD) protection device electrically connected to the first electronic component, a second electronic component, and an intermediate electronic component operatively electrically connected to and between the first and second electronic components so as to transfer signals from the first electronic component to the second electronic component. The (ESD) protection device has a plurality of metal-insulator-metal (MIM) capacitors comprising a lower electrode, a dielectric layer on the lower electrode, and an upper electrode on the dielectric layer, the (ESD) protection device has a resistance constituted by a body of resistive material, and the (ESD) protection device includes a transistor, a discharge line electrically connected to the resistance and along which an electrostatic discharge current flows to the transistor, and a ground line connected to the transistor and grounding the electrostatic discharge current. The body of resistive material of the ESD protection device is directly electrically connected to the upper electrode and equipotential with the lower electrode.

According to examples of the inventive concept, there are provided semiconductor devices including a substrate having an active region, and a transistor at the active region, interlayer insulation disposed on the substrate over the transistor, and a passive region and comprising passive electrical components disposed in and/or on the interlayer insulation above the level of the transistor, the passive electrical components comprising a resistor and at least one metal-insulator-metal (MIM) capacitor. The at least one MIM capacitor comprises a lower electrode, a dielectric layer on the lower electrode, and an upper electrode on the dielectric layer, the interlayer insulation is interposed between the transistor and each said at least one MIM capacitor, and the resistor is directly electrically connected to the upper electrode and is equipotential with the lower electrode of the at least one MIM capacitor.

BRIEF DESCRIPTION OF THE DRAWINGS

These and other features of the inventive concept will become more apparent by describing examples of the inventive concept with reference to the accompanying drawings of which.

DETAILED DESCRIPTION

Figure 1:
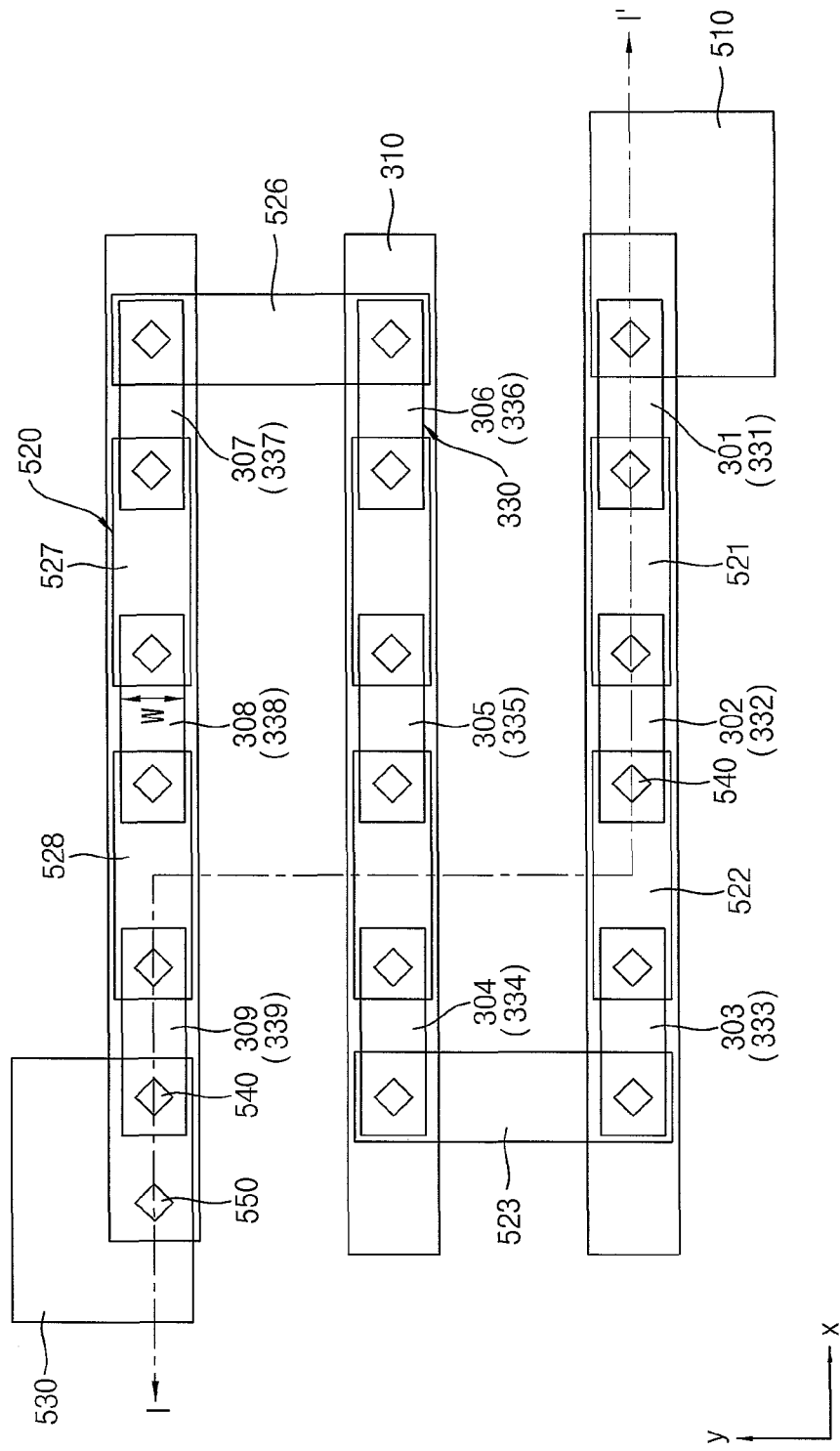
FIG. 1 is a plan view illustrating an analogue semiconductor device in accordance with an example of the present inventive concept.

Reference will now be made to detailed descriptions of examples of the inventive which are illustrated in the accompanying drawings. Like reference numerals designate like components throughout the drawings.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. It will also be understood that connections in the context of the inventive concept refer to electrical connections. Thus, "direct" electrical connections refer to connections between two electrical elements by means, as shown in the drawings, that do not include passive or active electrical circuit elements, such means consisting of a contact, via, wire or the like with little or relatively no resistance. Also, an "electrical connection" as used in the description that follows may be made active or inactive by supplying or interrupting a flow of electrical current thereto, i.e., may be switched "on" of "off" even though it physically remains in place.

Also, as is traditional in the field of the inventive concept, examples may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the inventive concepts. Likewise, the blocks of the examples may be physically combined into more complex blocks without departing from the scope of the inventive concept.

Figure 2:
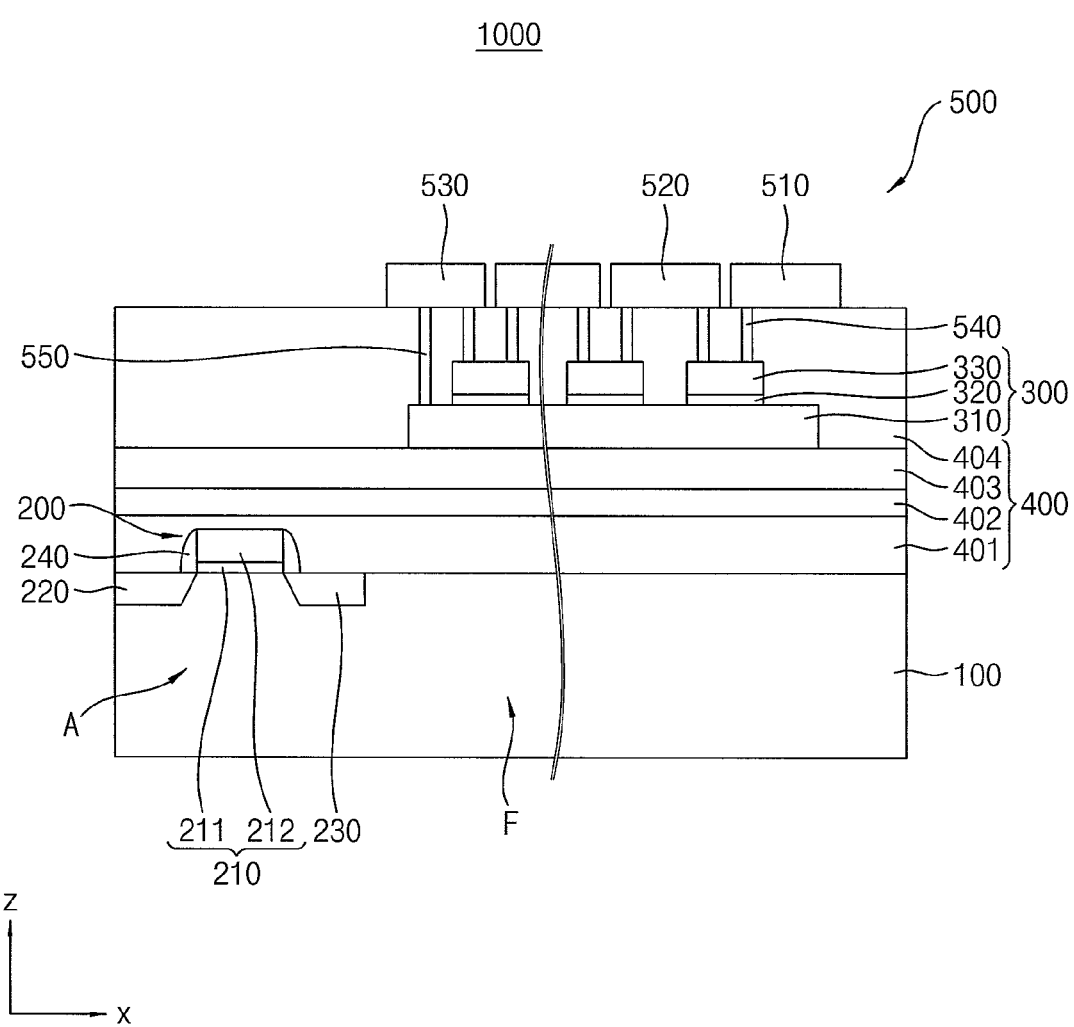
FIG. 2 a cross-sectional view taken along line of I-I' in FIG. 1.

Referring to FIGS. 1 and 2, an example of a semiconductor device 1000 in accordance with the inventive concept may include a substrate 100, a transistor 200, a plurality of metal-insulator-metal (MIM) capacitors 300 electrically separated from the transistor 200 and each constituted by a lower electrode 310, a dielectric layer 320 on the lower electrode 310 and an upper electrode 330 on the dielectric layer 320, an interlayer insulation 400 covering the transistor 200 and the MIM capacitors 300, and a resistance 500 connected to the upper electrode 330 and equipotential with the lower electrode 310.

The substrate 100 may include a semiconductor substrate such as a silicon (Si) substrate, a gallium (Ga)-arsenic (As) substrate, a silicon (Si)-germanium (Ge) substrate or a glass substrate for a flat display panel. In addition, the substrate 100 may include a silicon-on-insulator (SOI) substrate in which silicon layers are separated by an insulation layer. The substrate 100 may be any type of substrate having semiconductor characteristics. The substrate 100 may also be considered as that part of the device 1000 including the transistor 200.

The substrate 100 or device 1000 in general may include an active region A defined by a field region F. A gate structure 210 having a gate insulation layer 211 and a gate conductive layer 212 may be arranged in the active region A and source and drain junctions 220 and 230 may be arranged at surface portions of the active region A around the gate structure 210. A gate spacer 240 may be arranged on both sides of the gate structure 210. The source/drain junctions 220 and 230 may include a lightly doped region (not shown) and a heavily doped region (not shown). Thus, a transistor 200 having the gate structure 210 and the source/drain junctions 220 and 230 may be disposed in the active region A of the substrate 100.

A device isolation layer (not shown) may be arranged in the field region F of the substrate 100 such that the neighboring transistors 200 in the active region A are electrically insulated from each other by the device isolation layer. For example, the device isolation layer may include silicon oxide that may be formed by a local oxidation of silicon (LOCOS) process or a shallow-trench isolation (STI) process.

The transistor 200 may selectively amplify or switch off signals according to the device characteristics of the semiconductor device 1000. The substrate 100 may have a plurality of the transistors 200 according to various layouts depending on the operation requirements of the semiconductor device 1000.

The transistor 200 may be covered by interlayer insulation 400 and may be operatively connected to external components via various interconnectors (not shown) and wiring structures (not shown) penetrating through the interlayer insulation 400. The interlayer insulation 400 may include first to fourth insulation layers 401 to 404 that may be sequentially stacked on the transistor 200 and various metal wirings (not shown) may be interposed between the first to fourth insulation layers 401 to 404. The metal wirings may be interconnected with each other through via structures (not shown) that contact a contact plug (not shown). The contact plug may contact the source and drain junctions 220 and 230. Therefore, the transistor 200 may be electrically connected to external components through the metal wirings, the via structures and the contact plugs.

The capacitor 300 may be arranged on the interlayer insulation 400.

The capacitor 300 may be a metal-insulator-metal (MIM) capacitor in which the lower electrode 310 and the upper electrode 330 may be opposite to each other with respect to a dielectric layer 320. A plurality of the MIM capacitors may be provided according to operation requirements and desired device characteristics of the semiconductor device 1000.

In the present example, lower electrodes 310 of the MIM capacitors are a plurality of linear strips of metal (which may be referred to hereinafter as electrode "straps") arranged in the fourth insulation layer 404, i.e., in the top layer of the interlayer insulation 400. The straps may extend longitudinally in a first direction x and may be spaced apart by equal distances in a second direction y. Although three electrode straps are provided as lower electrodes 310 in the semiconductor device 1000 in the present example, more electrode straps may be arranged on the interlayer insulation 400 according to the number of the capacitors 300. Assemblies each including a dielectric layer 320 and upper electrode 330 may be arranged on each of the straps.

Thus, the capacitor 300 may be considered as a plurality of the MIM capacitors disposed on an insulating layer of the interlayer insulation 400. The dielectric layer 320 and the upper electrode 330 may have the same surface area, i.e., footprint, and the assemblies of the dielectric layer 320 and the upper electrode 330 may be spaced apart by uniform intervals along the same strap line. More specifically, assemblies of the dielectric layer 320 and the upper electrode 330 may be regularly arranged on the straps along the first and the second directions x and y, i.e., in a matrix. In the present example, first to ninth MIM capacitors 301 to 309 are arranged on the fourth insulation layer 404 in a 3×3 matrix.

The lower and the upper electrodes 310 and 330 may include different conductive materials. Examples of the material from which each of the upper and the lower and the upper electrodes 310 and 330 is made include ruthenium (Ru), ruthenium oxide (RuO2), palladium (Pt), iridium (Ir), iridium oxide (Ir2O3), strontium ruthenium oxide (SrRuO3), tantalum nitride (TaN), tungsten nitride (WN), titanium nitride (TiN), titanium aluminum oxide (TiAlN), cobalt (Co), copper (Cu), hafnium (Hf), and aluminum (Al). These may be used alone or in combinations thereof. In some examples of the inventive concept, the lower electrode 310 is formed of aluminum (Al) and the upper electrode 330 is formed of titanium nitride (TiN), tantalum nitride (TaN) or tungsten nitride (WN). The dielectric layer 320 may include silicon nitride (SiN), zirconium oxide (ZrO2), hafnium oxide (HfO2), titanium oxide (TiO2), tantalum oxide (Ta2O5), strontium titanium oxide (SrTiO3), calcium titanium oxide (CaTiO3), lanthanum aluminum oxide (LaAlO3), barium zirconium oxide (BaZrO3), barium strontium titanium oxide (BaSrTiO3), barium zirconium titanium oxide (BaZrTiO3), or strontium zirconium titanium oxide (SrZrTiO3). These may be used alone or in combinations thereof.

In some examples of the inventive concept, the upper electrode has a thickness of about 1 nm to about 500 nm.

An individual power source (not shown) may be connected to the lower electrode 310 and the upper electrode 330, so the capacitor 300 may function as a passive device of the semiconductor device 1000.

Although in the present example the capacitor 300 is stacked on the fourth insulation layer 404, modifications or other configurations of the disposition of the capacitor 300 are possible according to the inventive concept. For example, the lower electrode 310 of the MIM capacitor may be disposed on any one of the first to third insulation layers 401 to 403.

The transistor 200 and the capacitor 300 may be covered by the interlayer insulation 400 and may be protected from surroundings and insulated from each other by the interlayer insulation 400. To these ends, the interlayer insulation 400 may include an oxide layer having good gap-fill characteristics. Thus, the stepped portion between the transistor 200 and the capacitor 300 may be sufficiently filled with the interlayer insulation 400 and a top surface of the interlayer insulation 400 may be sufficiently flat.

The resistance 500 may be arranged on and/or in the interlayer insulation 400 together with wiring structures and may function as a passive electrical component of the semiconductor device 1000. More specifically, the resistance 500 provides a specified resistance of a circuit in the semiconductor device 1000. The resistance 500 may be referred to as a "derived resistor" or as a "derived resistance" of a circuit to encompass a plurality of electrically connected individual resistive bodies which in and of themselves may be referred to as resistors in series, for example. The resistance 500 may provide a specified resistance of a specific operation and function of a circuit in the semiconductor device 1000 such that the analogue operation characteristics of the semiconductor device 1000 as a controller or a driver are improved by the resistance. That is, in the context of the inventive concept, the term "resistance" will refer to that part of a circuit designed to provide a specified resistance (by opposing electrical current) and the term "resistor" or "resistive body" may refer to a passive element/elements that is/are dedicated to provide a specified resistance or part of the specified resistance in a circuit.

In the present example, the resistance 500 constitutes a BEOL resistor formed in a BEOL process that includes the forming of the interlayer insulation 400 and metal wirings after the FEOL process in which the transistor 200 is formed. Thus, there is practically no limit on the size, configuration and location of the resistance 500.

In addition, the resistance 500 may be connected to the upper electrodes 330 of the MIM capacitors 300, so that the resistance of the circuit may be easily designed for based on the number of upper electrodes 330 provided as electrically connected to the resistance 500.

Each resistive body 520 or individual resistor of the resistance 500 may be directly electrically connected to a pair of the neighboring upper electrodes 330, and first and second terminals 510 and 530 of the resistance 500 are each directly electrically connected to only a respective one of the upper electrodes 330.

The resistance 500 may also include resistor connectors 540. A pair of the resistor connectors 540 may be connected to each upper electrode 330 through the interlayer insulation 400, and each resistive body 520 may contact a pair of the resistor connectors 540 which may in turn contact neighboring ones of the upper electrodes 330, respectively. Thus, the upper electrodes 330 may be connected in series through the medium of the resistor connectors 540 and the bodies 520 of the resistance 500.

In the present example, the first to ninth MIM capacitors 301 to 309 are arranged in a matrix, a respective pair of the resistor connectors 540 may contact each upper electrode 331 to 339, and first to eighth resistor bodies 521 to 528 may be arranged on the interlayer insulation 400 at areas between the upper electrodes 330 of the MIM capacitors. Thus, neighboring upper electrodes 330 may be connected to each other through a single resistive body 520 and two neighboring resistor connectors 540 respectively connected to neighboring ones of the upper electrodes 330.

For example, the first body 521 may be connected to the first upper electrode 331 via a resistor connector 540 and simultaneously connected to the second upper electrode 332 via another resistor connector 540, so that the first and the second upper electrodes 331 and 332 are connected to each other via the first body 521 and the resistor connectors 540. In the same way, the first to ninth upper electrodes 331 to 339 may be connected in series via the first to eighth resistor bodies 521 to 528 and the resistor connectors 540.

In the present example, each resistive body 520 may be a conductive line spanning a region between neighboring ones of the upper electrodes 330. Thus, when spaced along a lower electrode 310 (strap), respective ones of the resistive bodies 520 may each extend longitudinally in the first direction x. In contrast, when arranged across neighboring ones of the lower electrodes 310, a resistive body 520 may extend longitudinally in the second direction y as do the third and sixth resistive bodies 523 and 526 in this example.

A spare resistor connector 540 directly electrically connected to the first upper electrode 331, but not to the first body 521, may also be directly electrically connected to the first terminal 510. Likewise, a spare resistor connector 540 directly electrically connected to the ninth upper electrode 331, but not to the eighth body 528, may also be directly electrically connected to the second terminal 530.

The first and the second terminal 510 and 530 may function as end points of the resistance 500 at which circuit components of the semiconductor device 1000 are connected to the resistance 500. As a result of the electrical connection between the resistance 500 and the circuit components, the resistance 500 may function as the passive device of the semiconductor device 1000.

The first and the second terminals 510 and 530 may each be a conductive rectangular pad. Thus, the contact area between the resistance 500 and the circuit components and between the spare resistor connectors 540 and the first and the second terminals 510 and 530 may be sufficiently large, to thereby facilitate the electrical connection at the first and the second terminals 510 and 530.

Each resistive body 520 and the first and the second terminals 510 and 530 may be of the same materials as the upper electrode 330 such as titanium nitride (TiN), tantalum nitride (TaN) or tungsten nitride (WN). However, any other material may also be used to form the resistive body 520 and the first and the second terminals 510 and 530 as long as the material allows for sufficient adherence to the resistor connector 540 and the resistance characteristics of the material provide the necessary resistances for compliance with the operation characteristics of the semiconductor device 1000.

In the present example, the upper electrode 330 may have a thickness of about 1 nm to about 500 nm and each body 520 may have a width of about 0.05 μm to about 50 μm.

Because the upper electrode 330 and the body 520 of each resistor may be provided as individual components, the upper electrodes 330 and the bodies 520 of the resistance may take various configurations and shapes which allows for great flexibility in design for achieving a desired overall resistance in a circuit (IC) provided by the semiconductor device 1000.

Furthermore, the overall resistance provided across the terminals 510 and 530 varies depending on the number of bodies of the resistance 500 actively electrically connected to the upper electrodes 330. Therefore, the overall resistance may be changed by changing the overall number of the upper electrodes 330 actively electrically connected to the bodies 520 of the resistors. For example, a re-directional line (not shown) may be connected to a resistor connector 540 and a resistor connector signal may be applied to the resistor connector 540 via the re-directional line. Thus, the active electrical connection between the resistor connector 540 and the body 520 in contact therewith may be selectively switched on or off and the number of resistors and the upper electrodes 330 connected in series may be controlled accordingly, whereby the overall resistance in the part of the circuit constituted by the resistance 500 can be controlled.

In the present example, the resistance 500 may be in a range of about a few tens of ohms to about a few thousands of ohms.

When the resistance 500 is relatively large, a parasitic capacitance may be generated between the resistance 500 and the lower electrodes 310 of the MIM capacitors 300.

So as to minimize the parasitic capacitance between the resistance 500 and the lower electrodes 310, the resistance 500 may include an equipotential connector 550 between one of the lower electrodes 310 and one of the first and the second terminals 510 and 530.

In the present example, the equipotential connector 550 is disposed on the lower electrode 310 of the ninth MIM capacitor 309 and is directly electrically connected to the second terminal 530. Because the bodies 520 and the first and the second terminals 510 and 530 are connected in series as the resistance 500, the first terminal 510 and each of the resistive bodies 520 is also electrically connected to the equipotential connector 550. Accordingly, parasitic capacitance between the lower electrodes 310 and the resistance 500 may be minimized by the equipotential connector 550. Thus, the resistance 500 may function effectively as a passive device in the semiconductor device 1000 irrespective of the presence of the MIM capacitors 300.

The resistor connectors 540 and the equipotential connector 550 may be formed of the same materials as the upper electrode 330 such that the parasitic capacitance may be prevented or minimized between the upper electrode 330 and the resistor connector 540 and between the upper electrode 330 and the equipotential connector 550. Also, when the first and the second terminals 510 and 530, the resistive bodies 520, the resistor connectors 540 and the equipotential connector 550 are all of the same material as the upper electrode 330, an overall resistance according to device specifications may be easily provided.

According to the above-described examples of semiconductor devices according to the inventive concept, the resistive bodies are disposed on a layer of the interlayer insulation in the BEOL process and may be connected to the upper electrode of each MIM capacitor via the resistor connectors, such that the resistance can be not only maximized in a small amount of space but also facilitating a varying of the resistance.

Compare this to the case in which a FEOL resistance is provided on the active region of the substrate together with transistors in the FEOL process. In this case, the desired resistance may be changed by subsequent metal and wiring processes. In addition, providing the FEOL resistance alongside the transistors requires a large area and hence, a large chip, which is not compatible with the recent trend of scaling down semiconductor devices. Furthermore, because the FEOL resistance is disposed under the interlayer insulation in a semiconductor device, certain configurations of resistive bodies may be hard to implement, which may make difficult to provide a desired resistance in the device.

On the other hand, as mentioned above, the main bodies of a resistance 500 of a semiconductor device according to the present inventive concept may be formed on a layer of interlayer insulation during a metal and wiring process such as that conducted in a BEOL process. Therefore, the various configurations of resistive bodies may be readily implemented, i.e., the inventive concept imposes far fewer limitations on the locations and sizes of resistive bodies constituting a resistor (resistance). In particular, a desired overall resistance may be easily obtained just by laying out and forming an appropriate number of the upper electrodes and resistive bodies electrically connected to thereto.

Therefore, the semiconductor device may have a resistance readily implemented and appropriate for a variety of different applications such as when the device is applied to a driver IC or a controller for operating a digital apparatus.

Furthermore, the resistive bodies on the interlayer insulation may be connected to a lower electrode of a capacitor under the interlayer insulation via the equipotential connector in such a way that the resistance may be equipotential with the lower electrode. Thus, the parasitic capacitance between the resistive bodies and the lower electrode may be sufficiently reduced or prevented to thereby significantly improve the stability and reliability of the semiconductor device.

Hereinafter, examples of digital apparatuses including the semiconductor device 1000, according to the inventive concept, will be described in detail.

Figure 3:
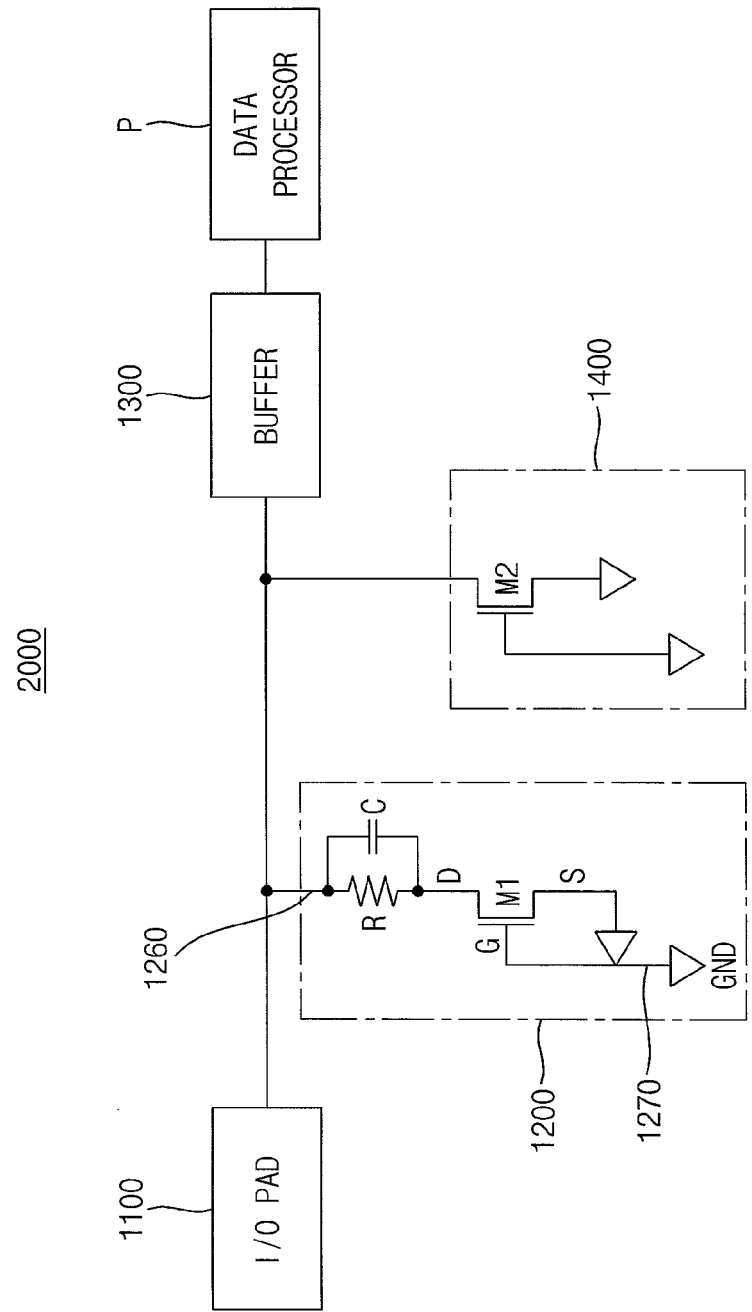
FIG. 3 is a schematic diagram illustrating a semiconductor integrated circuit (IC) device including the semiconductor device shown in FIGS. 1 and 2 in accordance with an example of the present inventive concept.
Figure 4:
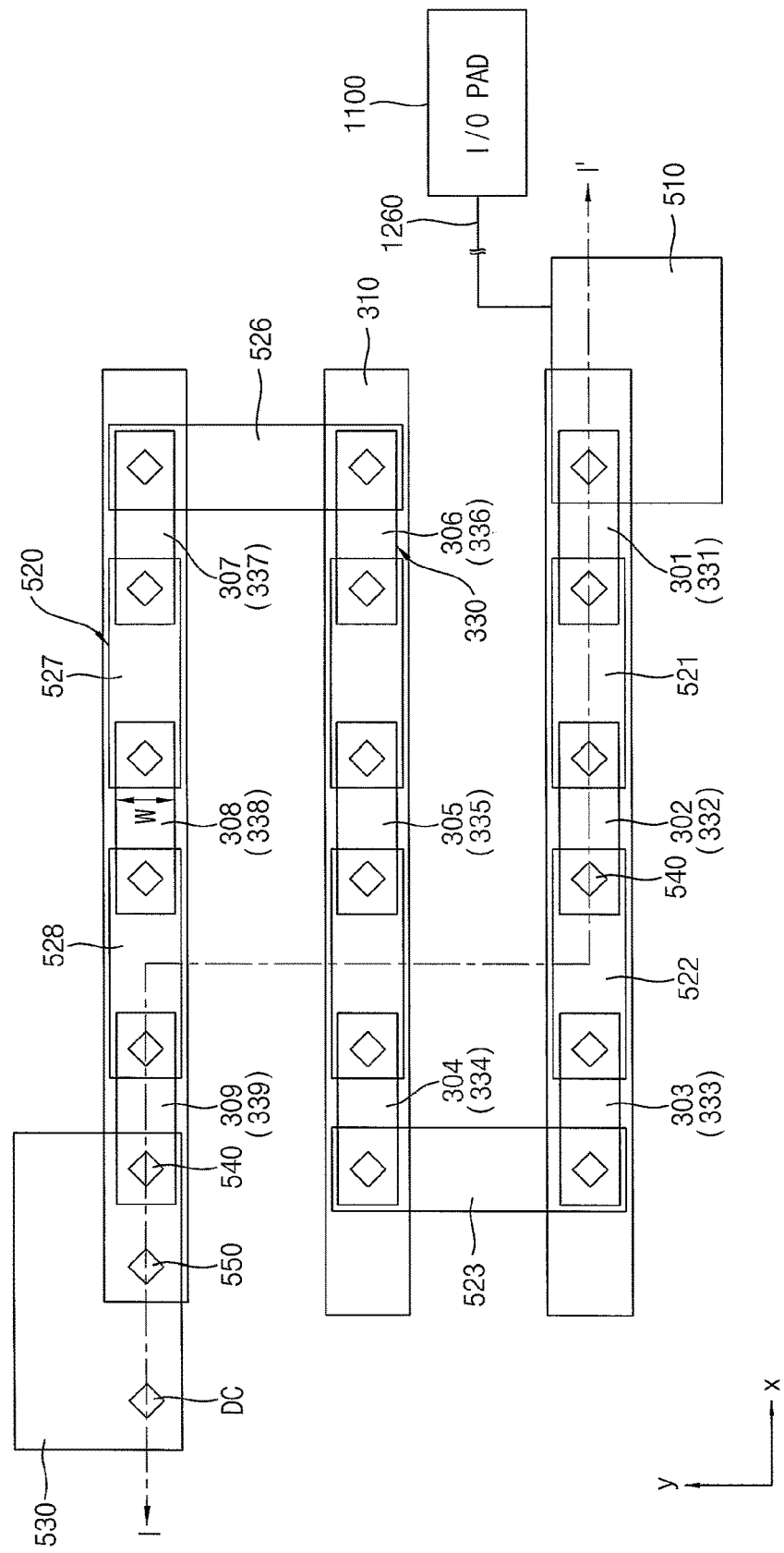
FIG. 4 is a plan view illustrating the semiconductor IC device shown in FIG. 3.
Figure 5:
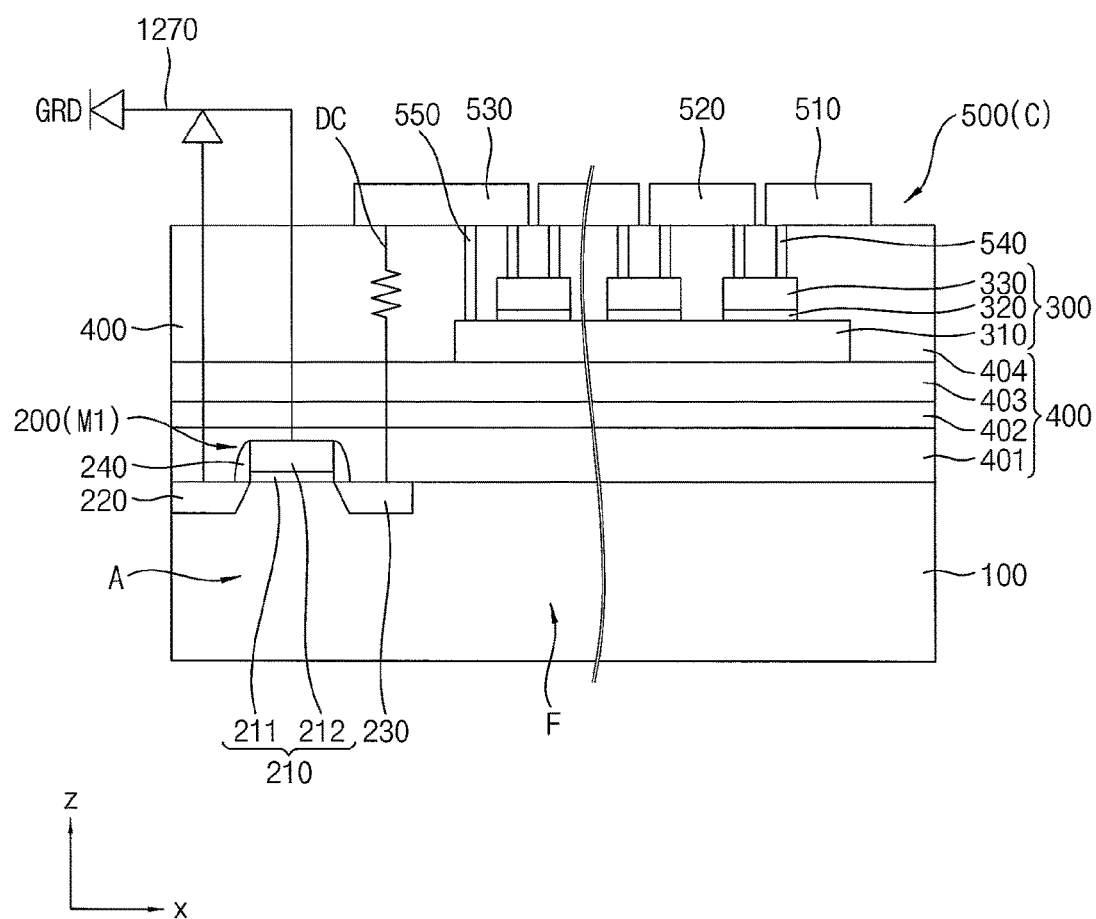
FIG. 5 is a cross-sectional view taken along line I-I' of FIG. 4.

Referring to FIGS. 3 to 5, a semiconductor IC device 2000 in accordance with an example of the present inventive concept may include an input/output (IO) pad 1100 (first electronic component) transferring input and output signals, an ESD protection device 1200 grounding an electrostatic current from an electrostatic discharge source (not shown) and a buffer 1300 (intermediate electronic component) connected to the I/O pad 1100 and transferring the input signals to a data processor P (second electronic component) in which the output signals are generated in response to the input signals. In another example, the semiconductor IC device 2000 may further include a charge device model (CDM) protection device 1400 for protecting the CDM from the electrostatic discharge current.

The I/O pad 1100 may be a peripheral interface of the semiconductor IC device 2000. The I/O pad 1100 may include a signal terminal such as an external input terminal of a memory device or an I/O bump. In addition, the IC device 2000 may include a data processor P for controlling an external system that may have a circuit board connected to the I/O pad 1100. In some examples, the I/O pad 1100 includes an output pad of a driver IC device of a display panel. The data processor P may include a memory device or an electronic system including a memory device and may be connected to the buffer 1300.

The input signals may be firstly transferred to the buffer 1300 before the data processor P, and may stand by or may be pre-processed before being subjected to data processing in the data processor P.

When an excessive electrostatic discharge current is supplied to the buffer, i.e., a current over a certain threshold, the ESD protection device 1200 may ground the excessive electrostatic discharge current to earth, thereby protecting the data processor P from the electrostatic discharge current.

To this end, the ESD protection device 1200 may include at least a transistor M1, a capacitance C in the form of a plurality of metal-insulator-metal (MIM) capacitors separated from the transistor M1, a resistance R, a discharge line 1260 connected to the resistance R and guiding an electrostatic discharge current to the transistor M1 and a ground line 1270 connected to the transistor M1 (via a contact plug connected to the source junction of the transistor M1, for example) and to a ground terminal GND.

When a normal current is transferred from the I/O pad 1100 as the input signal, the transistor M1 may be switched off and thus may have no effect on the operation of the semiconductor IC device 2000. The normal current may be transferred to the buffer 1300 and then be supplied to the data processor P.

However, when an electrostatic discharge current is transferred from the I/O pad 1100, drain and source junctions D and S of the transistor M1 may be connected to each other by a punch-through effect and thus, the electrostatic discharge current may flow to the source junction S of the transistor M1. Then, the electrostatic discharge current may flow to the source contact plug connected to ground terminal GRD and hence, be grounded from the source junction S of the transistor M1. Thus, the data processor P may be protected from the electrostatic discharge current.

The resistance R may control the amount of the electrostatic discharge current that passes through the discharge line 1260 in such a way that an excessive amount of electrostatic discharge current may not be supplied to the transistor M1. That is, the transistor M1 may be protected from an excessive amount of the electrostatic discharge current by the resistance R and the resistance R may protect the transistor M1.

In the present example, the ESD protection device 1200 may have substantially the same structure as the semiconductor device 1000 shown in FIGS. 1 and 2. In particular, the capacitance C and the transistor M1 of the ESD protection device 1200 may correspond to the MIM capacitors 300 and the transistor 200 of the semiconductor device 1000, and the resistance R of the ESD protection device 1200 may have the same structure as the resistance 500 of the semiconductor device 1000. The same reference numerals in FIG. 5 denote the same elements in FIGS. 1 and 2.

Referring to FIGS. 4 and 5, the resistance R for protecting the transistor M1 may be arranged on the interlayer insulation 400 and be connected to upper electrodes 330 of the MIM capacitors 300.

Thus, the resistance R may include at least one resistor whose body 520 is connected to a pair of neighboring upper electrodes 330, a first terminal 510 connected to the I/O pad 1100 and a single upper electrode 330, and a second terminal 520 connected to the transistor M1 and a single upper electrode 330 such that the first terminal 510, the body 520 of each resistor and the second terminal 530 may be connected in series via the upper electrodes 330 of the MIM capacitors 300 between the I/O pad 1100 and the transistor M1.

Therefore, the resistance R may be interposed between the I/O pad 1100 and the transistor M1 and the electrostatic discharge current may be blocked from flowing to the transistor M1 by the resistance R. The resistance R may be considered as also including a plurality of resistor connectors 540 and an equipotential connector 550. Neighboring resistor connectors 540 may contact one of the upper electrodes 330, and a body 520 of each resistor may contact a couple of the resistor connectors 540 that in turn contact the neighboring upper electrodes 330. The equipotential connector 550 may contact one of the first and the second terminals 510 and 530 and each of the first and the second terminals 510 and 530 may contact a respective resistor connector 540.

In the present example, the first and the second terminals 510 and 530 and the bodies 520 of the resistors are connected in series via the upper electrodes 330 of the MIM capacitors 300 and the resistor connectors 540.

Also, the first and the second terminals 510 and 530 and the bodies 520 of the resistors may be equipotential with the lower electrodes 310 of the MIM capacitors, so that parasitic capacitance between the lower electrodes 310 and the resistors is prevented or sufficiently reduced in the ESD protection device 1200. Accordingly, the ESD protection device 1200 may be operated under a sufficiently small parasitic capacitance although a sufficient resistance R is provided, thereby increasing the operation stability and reliability of the ESD protection device 1200.

The configurations and structures of the capacitance C, the interlayer insulation 400 and the resistance R may be substantially the same as those of the MIM capacitors 300, the interlayer insulation 400 and the resistance 500 described with reference to FIGS. 1 and 2.

For example, the transistor M1 may include a drain junction D (corresponding to 230) connected to the discharge line 1260 (corresponding to the second terminal 530) via a drain contact DC and a source junction S connected to the ground line 1270 in common with a gate electrode G (corresponding to gate electrode 210). In the present example, the transistor M1 may be a metal-oxide-semiconductor (MOS) transistor.

The drain contact DC may contact the second terminal 530 when the second terminal 530 is of a certain size. However, when the size of the second terminal 530 is insufficient for receiving the drain contact DC in view of the layout of the electrostatic discharge protection device 1200, the discharge line 1270 may extend a sufficient amount in such a way that the second terminal 530 may connect to the drain contact DC.

Although the transistor M1 has been described as a single MOS transistor in the present example, any other type of switching device may also be used for the transistor M1. For example, a complementary MOS transistor including a PMOS transistor and an NMOS transistor may be used for the transistor M1.

When a gate drive IC device or a data drive IC device of a mobile system provides the I/O pad 1100 and a mobile display panel is included as operatively connected to the data processor P so as to be driven by the same, for example, the resulting semiconductor IC device 2000 may be a mobile display drive IC (MDDI) device and the semiconductor device 1000 shown in FIGS. 1 and 2 may be used for the ESD protection device 1200 of the MDDI device to thereby improve the operation reliability and the stability of the MDDI.

Figure 6:
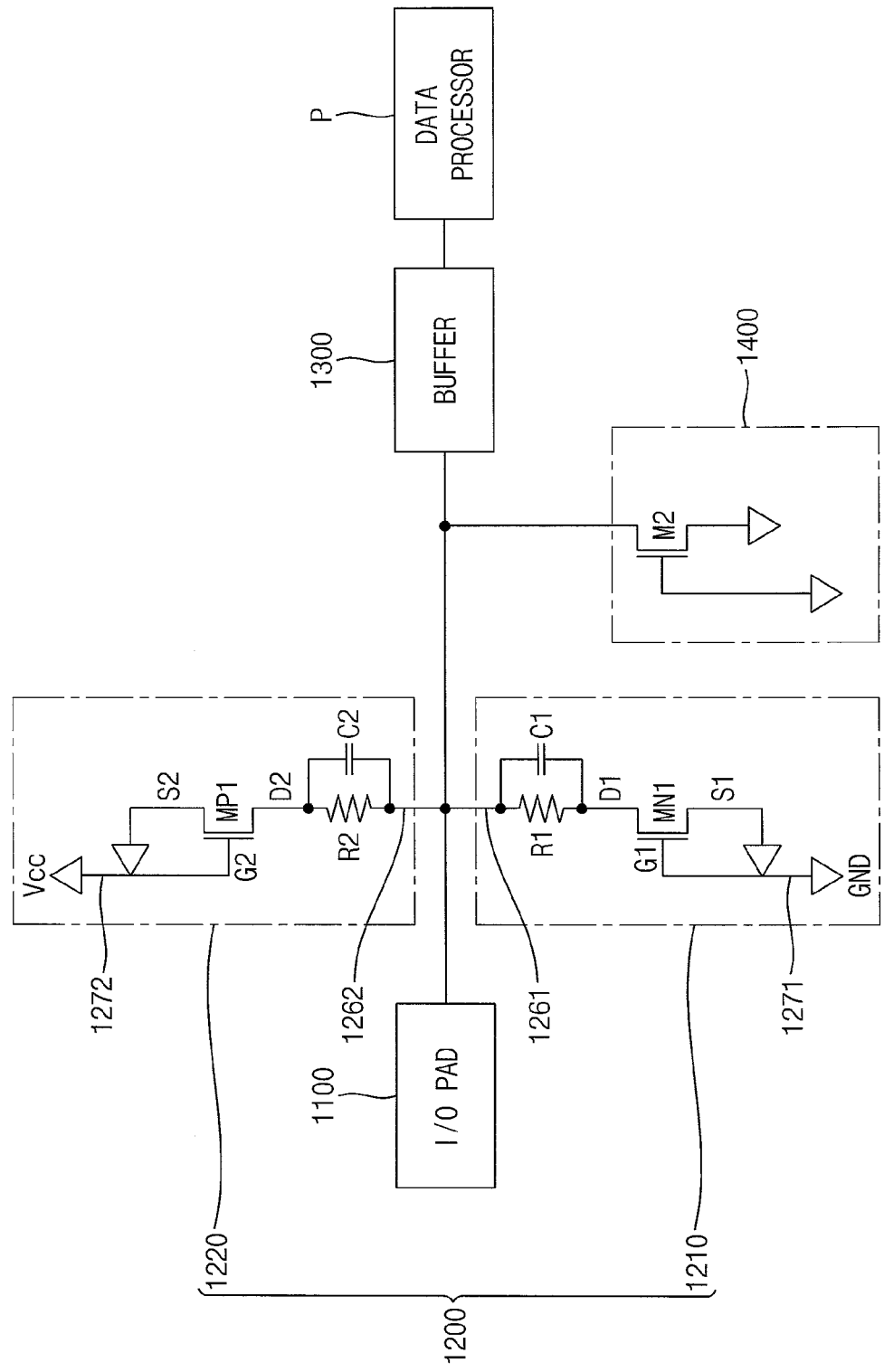
FIG. 6 is a schematic diagram illustrating a modification of the semiconductor integrated circuit (IC) device shown in FIG. 3 in accordance with an example of the present inventive concept.

FIG. 6 is a schematic diagram illustrating another example of a semiconductor integrated circuit (IC) in accordance with the present inventive concept.

Referring to FIG. 6, the semiconductor integrated circuit (IC) device 2001 may include the ESD protection device 1200 having a first protection device 1210 including an NMOS transistor MN1 and a second protection device 1220 including a PMOS transistor MP1.

The first protection device 1210 may include an NMOS transistor MN1, a plurality of first MIM capacitors constituting a first capacitance C1 separated from the NMOS transistor MN1, a first resistance R1, a first discharge line 1261 connected to the first resistance R1 and guiding an electrostatic discharge current to the NMOS transistor MN1 and a ground line 1271 connected to the NMOS transistor MN1 and grounding the electrostatic current to an earth.

The second protection device 1220 may include a PMOS transistor MP1, a plurality of second MIM capacitors constituting a second capacitance C2 separated from the PMOS transistor MP1, a second resistance R2, a second discharge line 1262 connected to the second resistance R2 and guiding an electrostatic discharge current to the PMOS transistor MP1 and a power line 1272 connected to the PMOS transistor MP1 and supplying electrical power to the semiconductor IC device 2001.

Accordingly, the resistance R of the ESD protection device 1200 may be arranged on the interlayer insulation 400 covering the transistor M1 and the MIM capacitors in such a way that the bodies 520 of the resistors constituting the resistance R and terminals 510 and 530 may be connected to the upper electrodes 330 of the MIM capacitors via the resistor connectors 540, so that the overall resistance may be easily controlled just by changing the (number of) active electrical connections between the upper electrodes 330 and the bodies 520 of the resistors. Thus, the resistance R may be changed in a range of about a few tens of ohms to about a few thousands of ohms in response to the magnitude of the electrostatic discharge current.

In addition, the lower electrodes 310 of the MIM capacitors may be equipotential with one of the first and the second terminals 510 and 530, so that the parasitic capacitance may be sufficiently reduced or minimized between the lower electrodes 310 and the resistors and the operation reliability of the ESD protection device 1200 may be significantly improved despite of the large area occupied by the resistors on the interlayer insulation 400.

Figure 7:
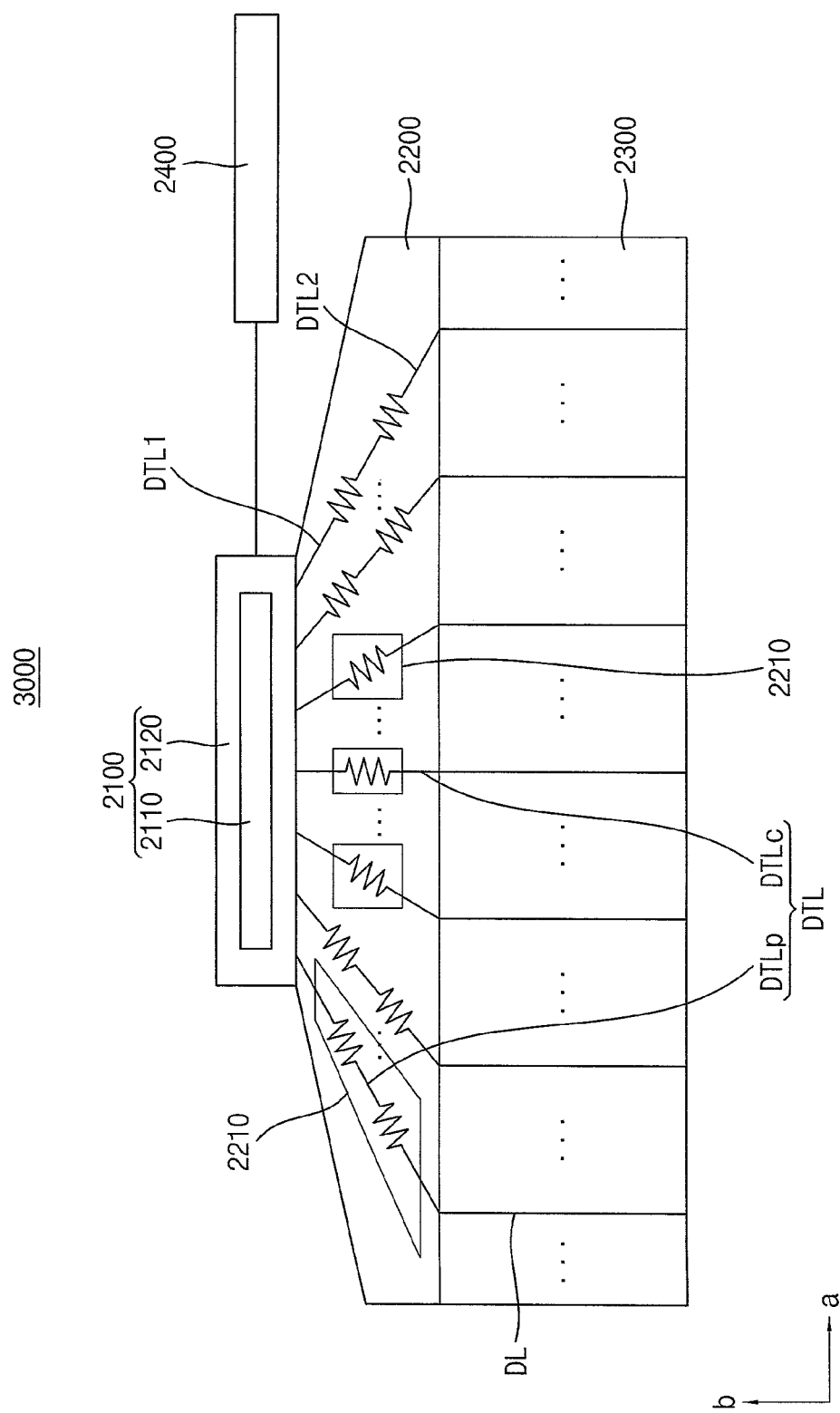
FIG. 7 is a schematic diagram illustrating a semiconductor integrated circuit (IC) device having the semiconductor device shown in FIGS. 1 and 2 in accordance with another example of the present inventive concept.
Figure 8:
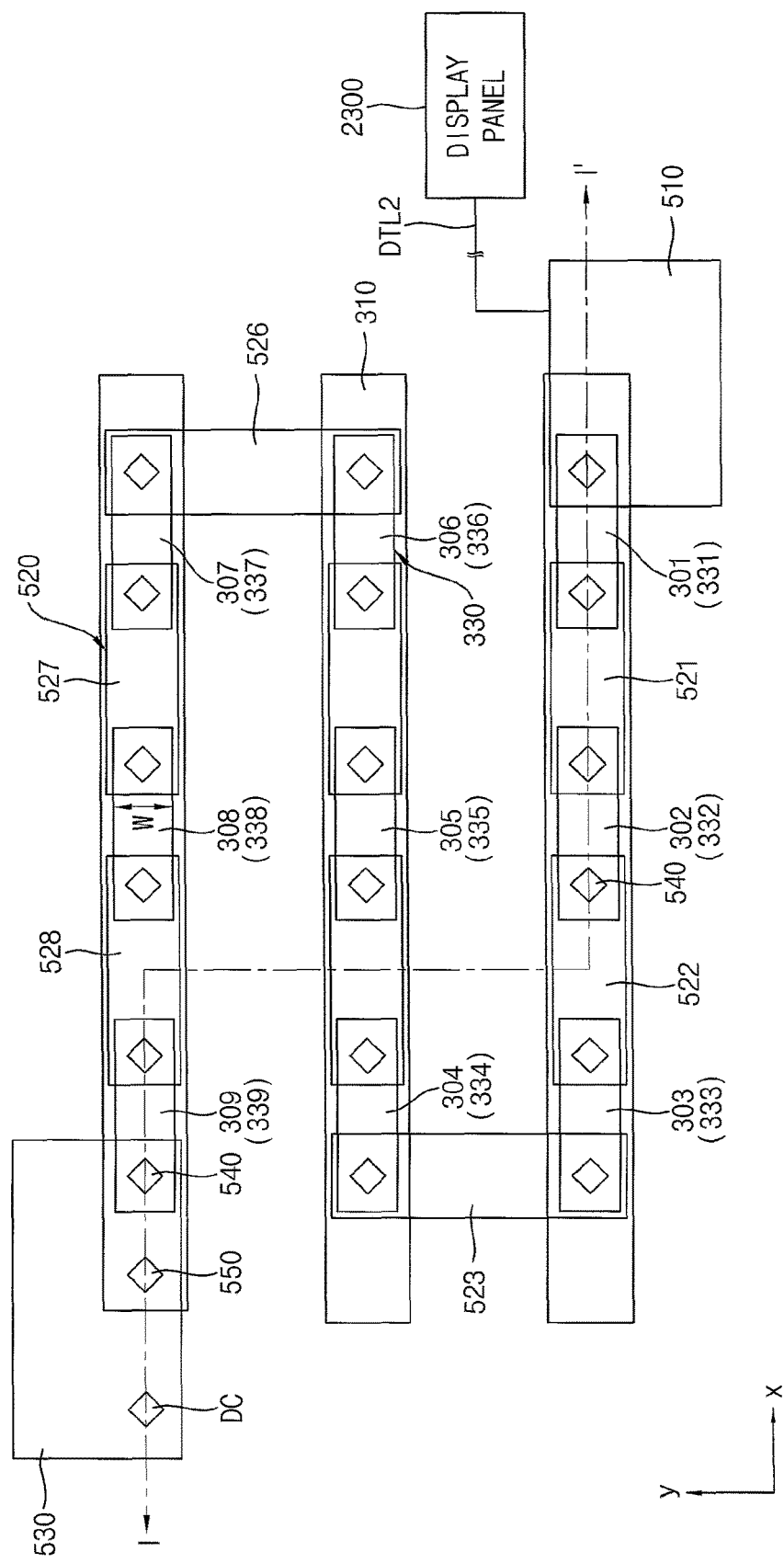
FIG. 8 is a plan view illustrating the semiconductor IC device shown in FIG. 7.
Figure 9:
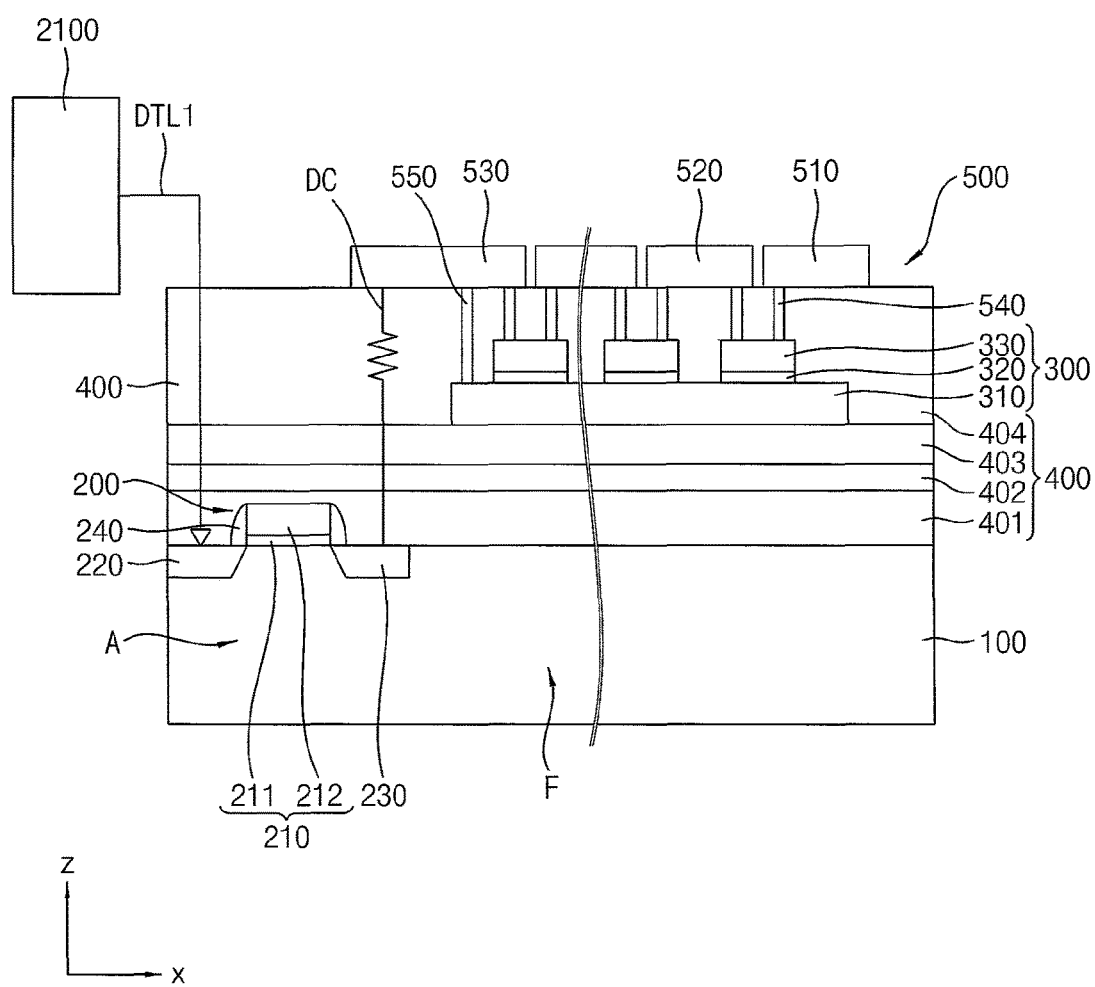
FIG. 9 is a cross-sectional view taken along line I-I' of FIG. 8.

FIG. 7 is a schematic diagram illustrating a semiconductor integrated circuit (IC) device having the semiconductor device shown in FIGS. 1 and 2 in accordance with another example of the present inventive concept. FIG. 8 is a plan view illustrating the semiconductor IC device shown in FIG. 7 and FIG. 9 is a cross-sectional view taken along a line I-I' of FIG. 8. The present example has a fan-out resistor section (referred to hereinafter simply as a "fan-out resistor" and as will be described in more detail below).

Referring to FIGS. 7 to 9, the semiconductor IC device 3000 in accordance with the present inventive concept may include a data drive IC device 2100 (first electronic component) for generating data signals, a display panel 2300 (second electronic component) displaying digital images in response to the data signals generated by the data drive IC device 2100 and gate signals generated by a gate drive IC device (not shown) and a fan-out resistor 2200 (intermediate electronic component) that may be connected with the data drive IC device 2100 and the display panel 2300 and may compensate for resistance deviations of data transfer lines DTL for transferring the data signals to data lines DL of the display panel 2300 in such a way that the data signals of each data line DL may have uniform intensity in the display panel 2300.

The semiconductor IC device 3000 may further include an ESD protection device 2400 for protecting the data drive IC device 2100 and the fan-out resistor 2200 from the electrostatic discharge currents. The ESD protection device 2400 may have substantially the same structure as the ESD protection device 1200 described in detail with reference to FIGS. 3 to 6 and thus detailed descriptions of the ESD protection device 2400 will be omitted.

The data drive IC device 2100 may include a driving chip 2110 for generating the data signals in response to external image signals and transferring the data signals to the data lines DL of the display panel 2300 and a circuit board 2120 to which the driving chip 2110 is mounted and the display panel 2300 is connected. Thus, the driving chip 2110 may communicate with the display panel 2300 through the circuit board 2120.

The display panel 2300 may include a plurality of data lines DL extending in a longitudinal direction b and a plurality of gate lines (not shown) extending in a latitudinal direction a. The data signals may be applied to each of the data lines DL by the data drive IC device 2100 and the gate signals may be applied to each of the gate lines by the gate drive IC device. The gate signals may activate the data signals into an image at corresponding pixels of the data lines DL such that the image is displayed on the display panel 2300 under the control of gate drive IC device.

The data signals may be transferred to the data lines DL of the display panel 2300 via the data transfer lines DTL of the circuit board and the fan-out resistor 2200 may be arranged on the circuit board 2120 for compensating for resistance deviations of the data transfer lines DTL. Thus, the data signals may be uniform among the data lines DL in the display panel 2300 despite differences in lengths of the data transfer lines DTL.

The greater the number of pixels of the display panel 2300, the greater the number of the data lines DL and the gate lines in the display panel 2300 must be and the larger the display panel 2300 becomes.

In the case of a relatively large display panel such as an LCD panel, a PDP panel or an LED panel, the length of the display panel 2300, i.e., a latitudinal size of the display panel, may be much greater than the width thereof, i.e., a longitudinal size of the display panel. Thus, although the lengths of the data lines DL may be uniform in the display panel 2300, the lengths of the data transfer lines DTL may vary along the length of the display panel 2300.

Further in this respect, the data drive IC device 2100 may be located at a side portion of the display panel 2300 and may be scaled down in accordance with recent semiconductor chip trends and the data lines DL may be spaced apart by the same distances along the latitudinal direction a in the display panel 2300. Because the date lines DL may need to be connected to the small and side-located data drive IC device 2100, the data transfer lines DTL for connecting the data drive IC device 2100 to the data lines DL may have different lengths. For example, when the data drive IC device 2100 is located at a central portion of the display panel 2300 along its length, a central line DTLc of the data transfer line DTL may be much shorter than a peripheral line DTLp of the data transfer line DTL.

For those reasons, although the data signals may have uniform intensity in the data drive IC device 2100, the signals transmitted along the data lines DL may have different intensities according to the locations data lines DL in the display panel due to the line resistance of the data transfer lines DTL between the data drive IC device 2100 and the display panel 2300.

Since line resistance of the central line DTLc may be much smaller than that of the peripheral line DTLp due to the difference in line lengths, the signal loss in the peripheral line DTLp may be much greater than that in the central line DTLc. As a result, the closer the data line DL is to a central portion of the display panel 2300, the smaller the line resistance of the data transfer lines DTL and the stronger the intensity of the data signal will be while the closer the data line DL is to a peripheral portion of the display panel 2300, the greater the line resistance of the data transfer lines DTL and the weaker the intensity of the data signal will be. Accordingly, the luminance of the display panel 2300 may gradually decrease from the central portion to the peripheral portion of the display panel 2300.

In such a case, the fan-out resistor 2200 may provide individual compensation resistances for each of the data transfer lines DTL in such a way that the magnitude of the compensation resistances vary for the data transfer lines DTL and the resulting overall resistance may be uniform across all of the data transfer lines DTL. Thus, the signal loss in each data transfer line DTL may be uniform and the intensity of the data signal may be uniform in the data lines DL irrespective of the relative locations of the data lines DL in the display panel 2300, thereby improving the luminance uniformity of the display panel 2300.

In the present example, the fan-out resistor 2300 may include a plurality of time constant resistance compensators 2210 that may be connected to the data transfer lines DTL in series, respectively. Thus, the same number of the time constant resistance compensators 2210 as the number of data transfer lines DTL may be arranged on the circuit board 2120.

The time constant resistance compensator 2210 may have the same structure as the semiconductor device 1000 described in detail with reference to FIGS. 1 and 2. In FIGS. 7 to 9, the same reference numerals denote the same elements in FIGS. 1 and 2.

The time constant resistance compensator 2210 may include at least one transistor 200 receiving the data signals, a plurality of MIM capacitors 300 separated from the transistor 200 and having lower electrodes 310, dielectric layers 320 and upper electrodes 330 and a resistance 500 connected to the upper electrodes 330 and equipotential with the lower electrodes 310. The resistances 500 may vary according to the data transfer line DTL connected to the resistances 500 in such a way that the resistances 500 may sufficiently compensate for the deviations of the line resistances of the data transfer lines DTL (differences in line resistance from a reference or base line value of resistance) so that the resistances may be made uniform across all of the assemblies each of a respective data transfer line DTL and time constant resistance compensator 2210.

For example, the resistance 500 may include at least one resistive body 520 connected to a couple of the neighboring upper electrodes 330, a first terminal 510 connected to the data line DL and a single of the upper electrode 330 and a second terminal 530 connected to the transistor 200 and a single of the upper electrode 330 in such a configuration that the first terminal 510, each resistive body 520 and the second terminal 530 may be connected with each other in series via the upper electrodes 330 of the MIM capacitor 300 between the data line DL and the transistor 200.

The data signals may be applied to the source junction 220 of the transistor 200 from the data drive IC device 2100 through a first transfer line DTL1, a head portion of the data transfer line DTL, and the transistor 200 may selectively amplify the data signals according to the line characteristics of each data transfer line DTL.

Then, the data signal may flow to the drain junction 230 of the transistor 200 and be transferred to the second terminal 530 of the resistance compensator 2210 through the drain contact DC. Then, the data signal may flow to a second transfer line DTL2, a tail portion of the data transfer line DTL1, via the upper electrode 330, the resistive body/bodies 520 and the first terminal 510. Subsequently, the data signal may be transferred to the data line DL of the display panel 2300 connected to the second data transfer line DTL2.

The central compensator, i.e., the resistance compensator 2210 connected to the central line DTLc, may have compensation resistance greater than that of the peripheral compensator, i.e., the resistance compensator 2210 connected to the peripheral line DTLp. In the present example, among the resistance compensators 2210, more upper electrodes 330 and resistive bodies 520 may be connected with each other in series in the central compensator than in the peripheral compensator.

Accordingly, the central line DTLc having a relatively small line resistance may be connected to the central compensator having a greater compensation resistance and the peripheral line DTLp having a relatively great line resistance may be connected to the central compensator having a smaller compensation resistance. Thus, an overall resistance of the assembly of the data transfer line DTL and the resistance compensator 2210 may be uniform and the signal loss of the data signal passing through of the assembly of the data transfer line DTL and the resistance compensator 2210 may be uniform, thereby improving the signal uniformity of the data signal and the luminance uniformity in the data line DL of the display panel 2300.

A plurality of the resistor connectors 540 may be provided in such a configuration that neighboring resistor connectors 540 contact a single upper electrode 330, and a single resistive body 520 may contact the resistor connectors that contact the neighboring upper electrodes 330. Therefore, the flow of current between each resistive body 520 and an upper electrode 330 may be selectively switched on or off through the resistor connectors 540, to thereby control the magnitude of the compensating resistance of the resistance 500.

The equipotential connector 550 may also be provided in such a configuration that one of the first and the second terminals 510 and 530 contacts the equipotential connector 550 and the other of the first and the second terminals 510 and 530 contacts a resistor connector 540. Therefore, the parasitic capacitance between the first and the second terminals 510 and 530 and the resistive bodies 520 and the lower electrode 310 may be sufficiently reduced or minimized, thereby improving the operation stability and reliability of the resistance compensator 2210.

In summary, the passive electrical components of the resistance compensator 2210 may be disposed on and/or in the interlayer insulation 400 and may be connected to the upper electrodes 330 of the MIM capacitors 300 through the resistor connectors 540, thereby facilitating the control of the compensation resistance of the resistance compensator 2210. A plurality of the resistance compensator 2210 may be connected to the data transfer lines DTL in series, respectively, and deviations of the line resistance of the data transfer lines DTL may be sufficiently compensated for so as to be made uniform. Thus, signal loss of the data signals through the data transfer lines DTL may be uniform and thus the data signals may have uniform intensities in the display panel 2300, thereby significantly improving the luminance uniformity especially in the case of a relatively large display panel.

Also, the resistor connectors 540 may facilitate varying the resistance of the resistance compensator 2210 by a switching operation between the upper electrode and a body of the resistance 500, so that the compensation resistance of the resistance compensator 2210 may be easily controlled according to the transfer line DTL connected to the resistance 500.

In addition, the lower electrode 310 of the MIM capacitor 300 may be set equipotential with the resistance 500 of the resistance compensator 2210 by the equipotential connector 550, thereby sufficiently reducing or minimizing the parasitic capacitance between the resistance 500 and the lower electrode 310 and improving the operation stability of the resistance compensator 2210.

According to the examples of the semiconductor device and semiconductor IC device including the same, a BEOL resistor may be disposed on a layer of interlayer insulation under which transistors, capacitors and contacts are disposed. The BEOL resistor may be connected to upper electrodes of the capacitors by resistor connectors. Therefore, the resistance of the BEOL resistor may be easily controlled just by in effect switching the resistor on or off (shorting the resistor) using the resistor connectors. In particular, when the semiconductor device is applied to a digital system as an analogue semiconductor device, the resistance of the BEOL resistor may be easily controlled according to operation requirements of the digital system.

Moreover, by locating BEOL resistor on the layer of interlayer insulation, there is a greater freedom of design in the size and location of the BEOL resistor in the semiconductor device, such that the BEOL resistor may provide a resistance meeting the requirement of any of a vast number of semiconductor devices having different operation characteristics.

Furthermore, the BEOL resistor is equipotential with a lower electrode of a MIM capacitor, thereby reducing or minimizing the parasitic capacitance between the BEOL resistor and the lower electrode of the capacitor and improving the operation stability of the semiconductor device.

Finally, although several examples of the inventive concept have been described above, those skilled in the art will readily appreciate that many modifications are possible without materially departing from the novel teachings and advantages of the inventive concept. Therefore, it is to be understood that the foregoing description is illustrative of the inventive concept and is not to be construed as limited to the specific examples disclosed, and that modifications to the disclosed examples, as well as other examples, are within the true spirit and scope of the inventive concept as defined by the appended claims.

What is claimed is:
1. A semiconductor device comprising:
a substrate having a transistor;
a plurality of metal-insulator-metal (MIM) capacitors, the MIM capacitors comprising a lower electrode, a dielectric layer on the lower electrode, and an upper electrode on the dielectric layer;
interlayer insulation covering the transistor and the MIM capacitors and interposed between the transistor and the plurality of MIM capacitors; and
a resistance comprising at least one resistive body electrically connected to the upper electrode and equipotential with the lower electrode, wherein the interlayer insulation includes at least one insulating layer,
the MIM capacitors comprise discrete lower electrodes, discrete dielectric layers and discrete upper electrodes,
the upper electrodes are disposed on the dielectric layers, respectively, such that each of the dielectric layers and the upper electrode disposed thereon together constitute an assembly,
the discrete lower electrodes comprise a set of uniformly spaced strips on a said insulating layer of the interlayer insulation, and
a plurality of said assemblies are disposed on each of the strips with the assemblies spaced along the strip such that a matrix of the assemblies is disposed on the lower electrodes.

2. The semiconductor device of claim 1, wherein each said at least one resistive body is directly electrically connected to adjacent ones of a respective pair of the upper electrodes of the MIM capacitors, and the resistance further comprises first and second terminals each directly electrically connected to a respective one only of the upper electrodes of the MIM capacitors.

3. The semiconductor device of claim 2, wherein the resistance further comprises a plurality of resistor connectors and an equipotential connector,
adjacent ones of a respective pair of the resistor connectors contact each of the upper electrodes,
each said at least one resistive body contacts each of the resistor connectors, of a pair of thereof, that contact adjacent ones of upper electrodes, and
one of the first and the second terminals contacts the equipotential connector and the other of the first and the second terminals contacts one of the resistor connectors.

4. The semiconductor device of claim 3, wherein each said at least one resistive body is a line-shaped conductive pad, and the first and the second terminals are each a rectangular conductive pad, the first terminal, the at least one resistive body, and the second terminal being electrically connected in series via the resistor connectors and the upper electrodes.

5. A semiconductor integrated circuit device comprising:
a first electronic component that transmits input signals in the device;
an electrostatic discharge (ESD) protection device electrically connected to the first electronic component,
a second electronic component; and
an intermediate electronic component operatively electrically connected to and between the first and second electronic components so as to transfer signals from the first electronic component to the second electronic component, and
wherein the (ESD) protection device has a plurality of metal-insulator-metal (MIM) capacitors comprising a lower electrode, a dielectric layer on the lower electrode, and an upper electrode on the dielectric layer, the (ESD) protection device has a resistance constituted by a body of resistive material, and the (ESD) protection device includes a transistor, a discharge line electrically connected to the resistance and along which an electrostatic discharge current flows to the transistor, and a ground line connected to the transistor and grounding the electrostatic discharge current, and
the body of resistive material of the ESD protection device is directly electrically connected to the upper electrode and equipotential with the lower electrode.

6. The semiconductor integrated circuit device of claim 5, wherein the plurality of MIM capacitors comprise discrete upper electrodes,
the resistance includes at least one said body of resistive material each directly electrically connected to adjacent ones of a respective pair of the upper electrodes, a first terminal electrically connected to the first electrical component and directly electrically connected to a respective one of the upper electrodes, and a second terminal electrically connected to the transistor and directly electrically connected to a respective one of the upper electrodes, and
the first terminal, the at least one body of resistive material and the second terminal are connected in series via the upper electrodes of the MIM capacitors between the first electrical component and the transistor.

7. The semiconductor integrated circuit device of claim 6, wherein the resistance further comprises a plurality of resistor connectors and an equipotential connector,
adjacent ones of the resistor connectors, of pairs of the resistor connectors, contact the upper electrodes, respectively, and
each said at least one resistive body contacts the resistor connectors, of a respective thereof, that contact adjacent ones of the upper electrodes,
one of the first and the second terminals contacts the equipotential connector and the other of the first and the second terminals contacts one of the resistor connectors.

8. The semiconductor integrated circuit device of claim 5, wherein the transistor comprises a metal-oxide-semiconductor (MOS) transistor having a drain that is electrically connected to the discharge line and a gate electrode and a source that are electrically connected to the ground line.

9. The semiconductor integrated circuit device of claim 5, wherein the transistor comprises a complementary MOS (CMOS) transistor including a p-type MOS (PMOS) transistor and an n-type MOS (NMOS) transistor,
the discharge line has a first section that is electrically connected to a drain junction of the NMOS transistor and a second section that is electrically connected to a drain junction of the PMOS transistor, and
the resistance includes a first resistance that is electrically connected to the first section of the discharge line and a second resistance that is electrically connected to the second section of the discharge line.

10. The semiconductor integrated circuit device of claim 5, wherein the first electronic component is a data drive integrated circuit (IC) that transmits image data signals as said input signals, and the second electronic component is a display panel that displays digital images in response to the image data signals.

11. The semiconductor integrated circuit device of claim 10, wherein the display panel includes data lines along which data signals are transmitted within the panel, and
the intermediate electronic component is a fan-out resistor section electrically connected the data drive IC and the display panel, the fan-out resistor section having data transfer lines electrically connected to the data lines of the display panel, respectively, to transfer the data signals to the data lines, and configured to compensate for line resistance deviations of the data transfer lines such that the data signals transmitted in each of the data lines contain image information of uniform intensity in the display panel.

12. The semiconductor integrated circuit device of claim 11, wherein the fan-out resistor section comprises time constant resistance compensators that are electrically connected in series with the data transfer lines, respectively, and compensate for the line resistance deviations, each of the time constant resistance compensators including a transistor receiving the image data signals from the data drive IC, a plurality of MIM capacitors having lower electrodes, dielectric layers and upper electrodes, and a resistor that is directly electrically connected to the upper electrode and equipotential with the lower electrode.

13. The semiconductor integrated circuit device of claim 12, wherein in each of the time constant resistance compensators, the resistor includes at least one body of resistive material electrically connected to neighboring ones of the upper electrodes, a first terminal electrically connected to a respective one of the data lines and one of the upper electrodes and a second terminal electrically connected to the transistor and another of the upper electrodes, the first terminal, the at least one body of resistive material and the second terminal being electrically connected in series between the respective one of the data lines and the transistor by the upper electrodes of the MIM capacitors.

14. The semiconductor integrated circuit device of claim 13, wherein in each of the time constant resistance compensators, the resistor includes a plurality of resistor connectors and an equipotential connector, adjacent ones of the resistor connectors contact one of the upper electrodes, each said at least one body of resistive material contacts the resistor connectors of a respective pair thereof that contact neighboring ones of the upper electrodes, and one of the first and the second terminals contacts the equipotential connector and the other of the first and the second terminals contacts a respective one of the resistor connectors.

15. The semiconductor integrated circuit device of claim 5, wherein the first electronic component is an I/O interface, the second electronic component is a data processor, and the intermediate electronic component is a buffer operatively electrically connected to and between the I/O interface and the data processor and configured to transfer input signals from the I/O interface to the data processor.

16. A semiconductor device comprising:
 a substrate having an active region, and a transistor at the active region;
 interlayer insulation disposed on the substrate over the transistor; and
 a passive region and comprising passive electrical components disposed in and/or on the interlayer insulation above the level of the transistor, the passive electrical components comprising a resistor and at least one metal-insulator-metal (MIM) capacitor,
wherein the at least one MIM capacitor comprises a lower electrode, a dielectric layer on the lower electrode, and an upper electrode on the dielectric layer,
the interlayer insulation is interposed between the transistor and each said at least one MIM capacitor, and
the resistor is directly electrically connected to the upper electrode and is equipotential with the lower electrode of the at least one MIM capacitor,
wherein the at least one MIM capacitor comprises discrete lower electrodes, dielectric layers on the lower electrodes, and discrete upper electrodes on the dielectric layers, and
the resistor comprises a layer of discrete bodies of resistive material, a first terminal and a second terminal, a plurality of resistor connectors, and an equipotential connector,
adjacent ones of each pair of the discrete bodies of resistive material contacting a respective pair of the resistor connectors, and the resistor connectors of each said respective pair contacting a respective one of the upper electrodes,
the equipotential connector extending between and contacting one of the first and second terminals and one of the upper electrodes, and the other of the first and second terminals contacting the other of the first and second terminals, and
the discrete bodies of resistive material being electrically connected to and in series between the first and second terminals by said at least one MIM capacitor.

17. The semiconductor device of claim 16, wherein the discrete bodies of resistive material are each linear and are disposed at the same level in the device relative to an upper surface of the substrate, and
 the terminals are rectangular bodies of conductive material, respectively, and are disposed at the same level as the bodies of resistive material.

18. The semiconductor device of claim 16, wherein the transistor has a gate, a source region and a drain region, and further comprising a drain contact extending vertically in the interlayer insulation from said one of the upper electrodes to the drain region.

* * * * *